United States Patent [19]

Ikeda et al.

[11] Patent Number: 5,101,172

[45] Date of Patent: Mar. 31, 1992

[54] LINEAR AMPLIFIER

[75] Inventors: Yukio Ikeda; Gen Toyoshima; Noriharu Suematsu; Yoji Isota; Tadashi Takagi; Shuji Urasaki, all of Kanagawa, Japan

[73] Assignee: Mitsubishi Denki Kabushiki Kaisha, Tokyo, Japan

[21] Appl. No.: 630,474

[22] Filed: Dec. 19, 1990

[30] Foreign Application Priority Data

Dec. 26, 1989 [JP] Japan .................................. 1-341401

[51] Int. Cl.5 ............................................. H03G 3/20
[52] U.S. Cl. ................................... 330/136; 330/144; 330/284
[58] Field of Search ............... 330/136, 144, 145, 284; 455/116, 126, 127

[56] References Cited

FOREIGN PATENT DOCUMENTS

| 113603 | 7/1982 | Japan | ................................... 330/149 |
| 78902 | 4/1987 | Japan | ................................... 330/149 |
| 1246209 | 9/1971 | United Kingdom | ................. 330/149 |
| 1474951 | 5/1977 | United Kingdom . | |

Primary Examiner—James B. Mullins
Attorney, Agent, or Firm—Rothwell, Figg, Ernst & Kurz

[57] ABSTRACT

A linear amplifier includes a variable attenuator and a phase shifter for modifying the amplitude and phase of an input signal to compensate for amplitude and phase distortion caused by non-linear characteristics of a high-powered amplifier utilized in a microwave band communications system. An amplitude comparator and a phase comparator compare the amplitudes and phases of input and output signals of the linear amplifier circuit to develop control signals for controlling the operation of the variable attenuator and phase shifter. The elimination of digital signal processing circuitry allows increased speed of operation that is essential for use in the microwave bands.

5 Claims, 4 Drawing Sheets

LINEAR AMPLIFIER

BACKGROUND OF THE INVENTION

1. Field of the Invention

The present invention relates to a linear amplifier, and particularly to a linear amplifier having good distortion and efficiency characteristics over semi-microwave and microwave bands which are employed in satellite communication systems, ground microwave communication systems and the like.

2. Description of the Prior Art

FIG. 1 is a block diagram showing a conventional linear amplifier disclosed in, for example, "6 GHZ Adaptive-Type Linearizer for Satellite Communication Earth Station HPA" by Sato and Kimura on pp. 10-195, at the national meeting of Institute of Electronics and Communication, 1986. Referring to FIG. 1, there are shown an input terminal 1, an output terminal 2, a high-powered amplifier (HPA) 5, a level control unit 17, a linearizer 18, a linearizer control unit 19 and a spectrum analyzer 20.

A description will now be made of the operation of the linear amplifier.

A signal inputted from the input terminal 1 is applied to the high-powered amplifier 5 via the level control unit 17 and the linearizer 18 and is outputted at output terminal 2. Portions of the input signal at terminal 1 and the output signal of high powered amplifier 5 are extracted by level control unit 17 and are applied to linearizer control unit 19.

The linearizer control unit 19 controls the linearizer 18 to make the levels of the input signal at terminal 1 and the output of HPA 5 equal to each other to perform its switching action, and supplies the input and output signals to the spectrum analyzer 20 which analyzes the frequency content of these signals.

The linearizer control unit 19 stores therein information about the frequency spectrum distribution of the components of the input/output signals measured by the spectrum analyzer 20 and performs arithmetic processing on the same, and thereafter supplies data for controlling the linearizer's characteristics to the linearizer 18 so that distortion components of the input/output signals are reduced.

The level control unit 17 includes a variable attenuator and a variable gain amplifier to correct the variation in level of each of the signals according to the control of the linearizer's characteristics so as to maintain a constant gain for the entire system comprising the level control unit 17, linearizer 18, and HPA 5.

The above conventional linear amplifier has a function for determining the difference between the frequency spectrum distribution of the input signal and that of the output signal of the high-powered amplifier 5 to automatically control the linearizer's characteristics such that the components of unnecessary distortion are reduced.

Since the conventional linear amplifier is constructed as described above, it is accompanied by the problem in that the spectrum analyzer, the linearizer control unit and the like are necessary components, so that the overall arrangement is constructed of large size, the operation efficiency is low because the high-powered amplifier is operated in a good linear region well below a saturation region and the operation rate is slow because data processing is effected by using digital circuitry applied to the control of the linearizer, thus leading to difficulty in the application of the linear amplifier to high-frequency band communication channels.

SUMMARY OF THE INVENTION

With the foregoing problem in view, it is an object of the present invention to provide a linear amplifier constructed in small size and operable at higher efficiency and at a high-frequency band.

In order to achieve the above object, the linear amplifier according to the present invention is constructed such that a first directional coupler, a variable attenuator, a phase shifter and a high-powered amplifier connected to an input terminal and a second directional coupler connected to an output terminal are arranged in cascade connection, and the comparison in amplitude and in phase between input and output signals extracted from the first and second directional couplers respectively is made to detect the amplitude and phase distortion of the high-powered amplifier based on the result of the comparison, thus controlling the amount of attenuation of the variable attenuator and the amount of phase shift of the phase shifter in a manner so as to compensate for the detected amplitude and phase distortion and controlling a DC/DC converter such that a drain voltage applied to the high-powered amplifier becomes high when the output signal is large in level whereas the drain voltage becomes low when the output signal is low in level.

The above and other objects, features and advantages of the present invention will become apparent from the following description and the appended claims, taken in conjunction with the accompanying drawings in which preferred embodiment of the present invention are shown by way of illustrative example.

DETAILED DESCRIPTION OF THE PREFERRED EMBODIMENTS

Preferred embodiments of this invention will hereinafter be described in detail with reference to the accompanying drawings.

Figure 1:
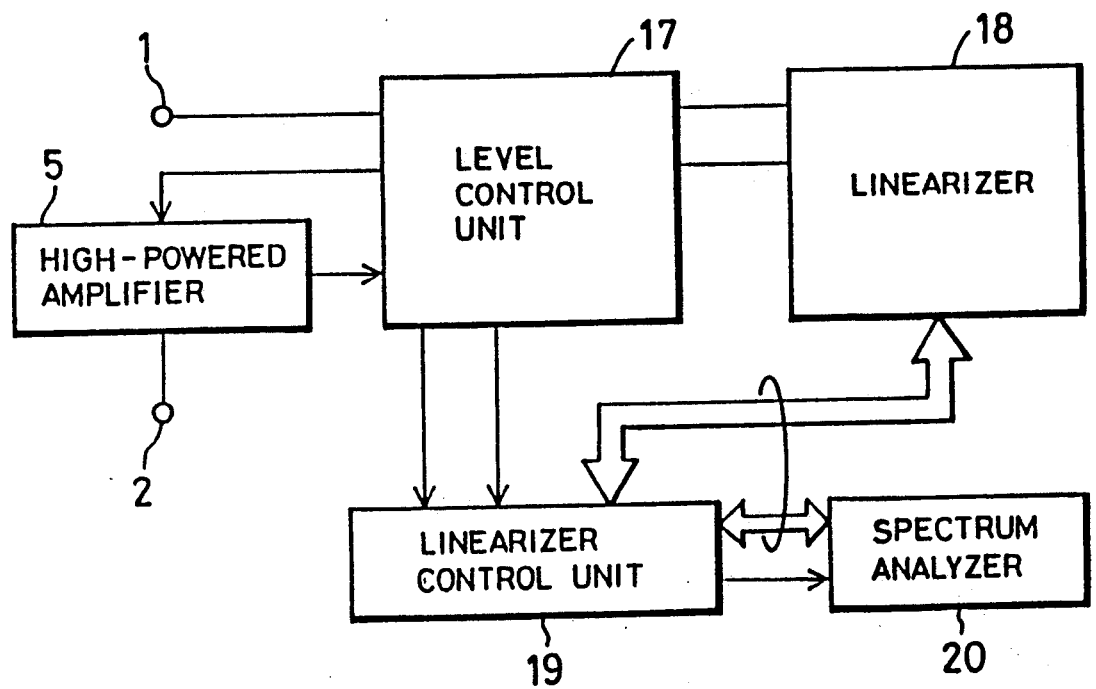
FIG. 1 is a block diagram showing a conventional linear amplifier.
Figure 2:
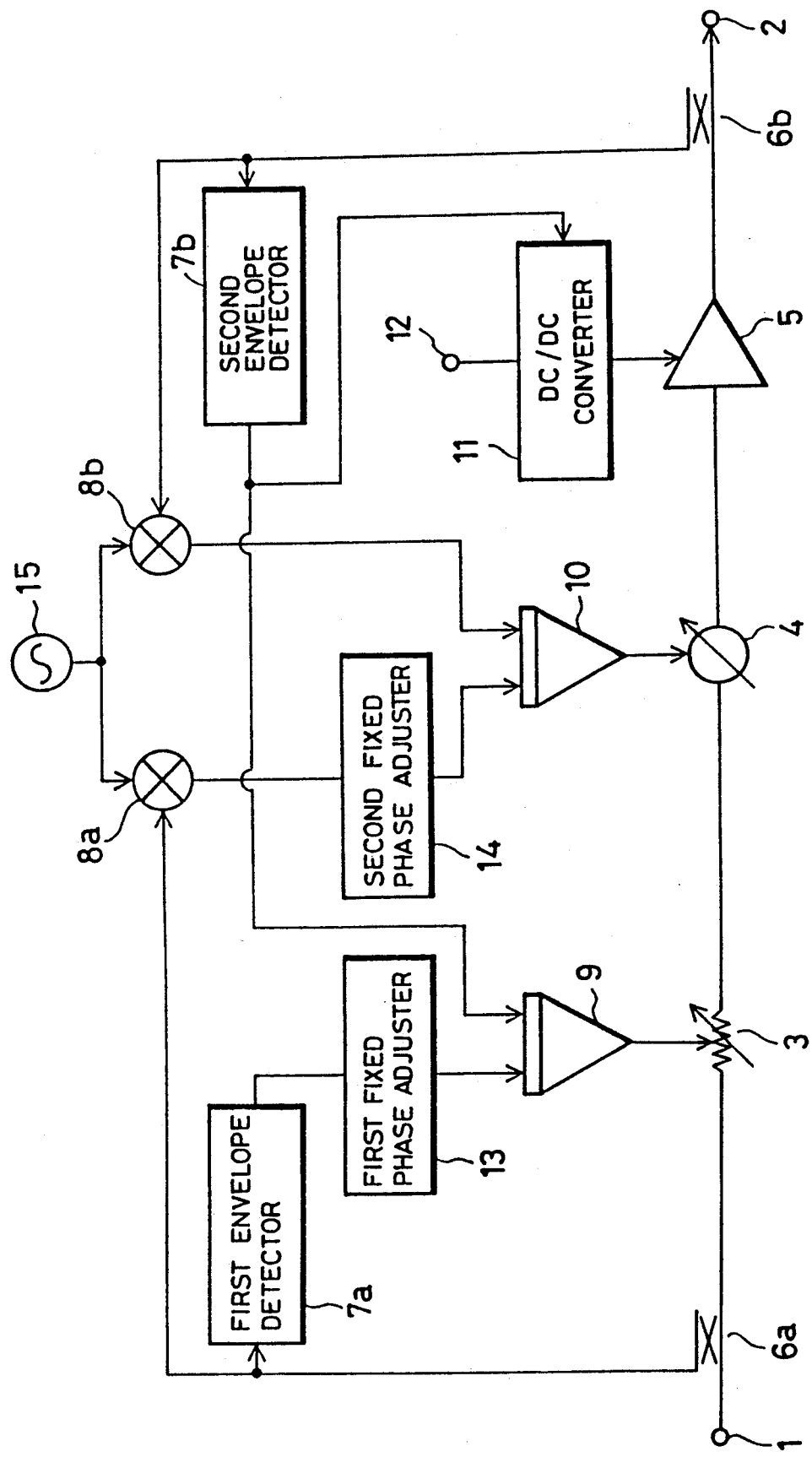
FIG. 2 is a block diagram depicting a linear amplifier according to a first embodiment of this invention.

In FIG. 2 illustrating a first embodiment, there are shown an input terminal 1, an output terminal 2, a variable attenuator 3, a phase shifter 4, a high-powered amplifier 5, first and second directional couplers 6a, 6b, first and second envelope detectors 7a, 7b, first and second phase detectors 8a, 8b, a first comparator 9, a second comparator 10, a DC/DC converter 11, a drain voltage supply terminal 12, a first fixed phase adjuster 13, a second fixed phase adjuster 14 and a local oscillator 15.

A description will now be made of the operation of the first embodiment.

A modulated wave inputted to the input terminal 1 is outputted from the output terminal 2 via the first directional coupler 6a, the variable attenuator 3, the phase shifter 4, the high-powered amplifier 5 and the second directional coupler 6b which are arranged in cascade connection. Parts of the input and output signals are extracted by the first and second directional couplers 6a, 6b, respectively and their envelope components are detected by the first and second envelope detectors 7a and 7b respectively.

The envelope component of the input signal is applied to the first comparator 9 via the first fixed phase adjuster 13, whereas the component of the envelope of the output signal is applied directly to the first comparator 9. The first fixed phase adjuster 13 compensates a fixed phase difference between the input and output signal caused by their different transmission paths.

The first comparator 9 compares the envelope component of the input signal with the envelope component of the output signal to detect the amount of amplitude distortion caused by the high-powered amplifier 5, and based on the result of its comparison, thereby controlling the variable attenuator 3 in a manner as to compensate for the amplitude distortion.

The parts of the input and output signals extracted by the first and second directional couplers 6a, 6b are further applied to the first and second phase detectors 8a, 8b, respectively, from which the phase components of these signals are detected.

The phase component of the input signal is applied to the second comparator 10 via the second fixed phase adjuster 14, whereas the phase component of the output signal is applied directly to the second comparator 10. The second fixed phase adjuster 14 provides a function equal to first fixed phase adjuster 13.

The second comparator 10 compares the phase component of the input signal and the phase component of the output signal to detect the amount of phase distortion produced by the high-powered amplifier 5, and based on the result of its comparison, thereby controlling the phase shifter 4 in a manner so as to compensate for the phase distortion.

The DC/DC converter 11 is activated to increase a drain voltage to be supplied to the high-powered amplifier 5 based on the envelope component of the output signal when its amplitude is large, and on the contrary, to reduce the drain voltage based on the envelope component of the output signal when its amplitude is small.

Figure 4:
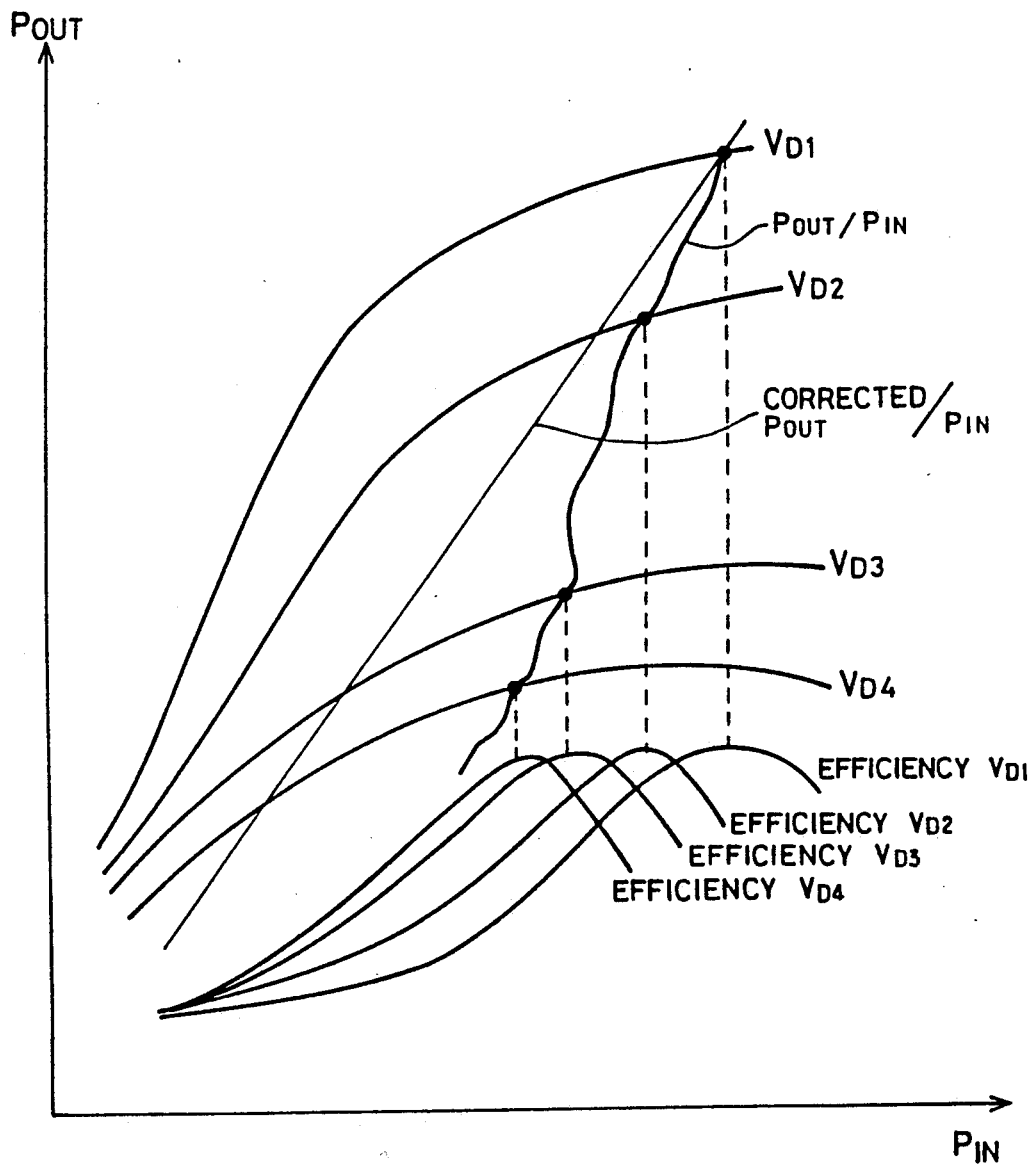
FIG. 4 is a graph of input/output power characteristics of an amplifier for explaining the principle of the present invention.

The input/output characteristics for amplifier 5 are shown in the graph of FIG. 4. As shown, higher drain voltages $V_D$ are needed for higher input signal levels $P_{in}$. The efficiency curve for each drain voltage is also shown. As it is desired to operate at the highest or maximum efficiency point of the amplifier characteristic curve, the $P_{out}/P_{in}$ curve is selected for various drain voltages according to the input signal level at the maximum efficiency points. However, these points correspond to the non-linear gain range of the amplifier. The purpose of the present invention is to compensate amplitude and phase distortions of the amplifier to correct the values of the $P_{out}/P_{in}$ curve for each input signal value so as to linearize the $P_{out}/P_{in}$ curve as shown.

Figure 3:
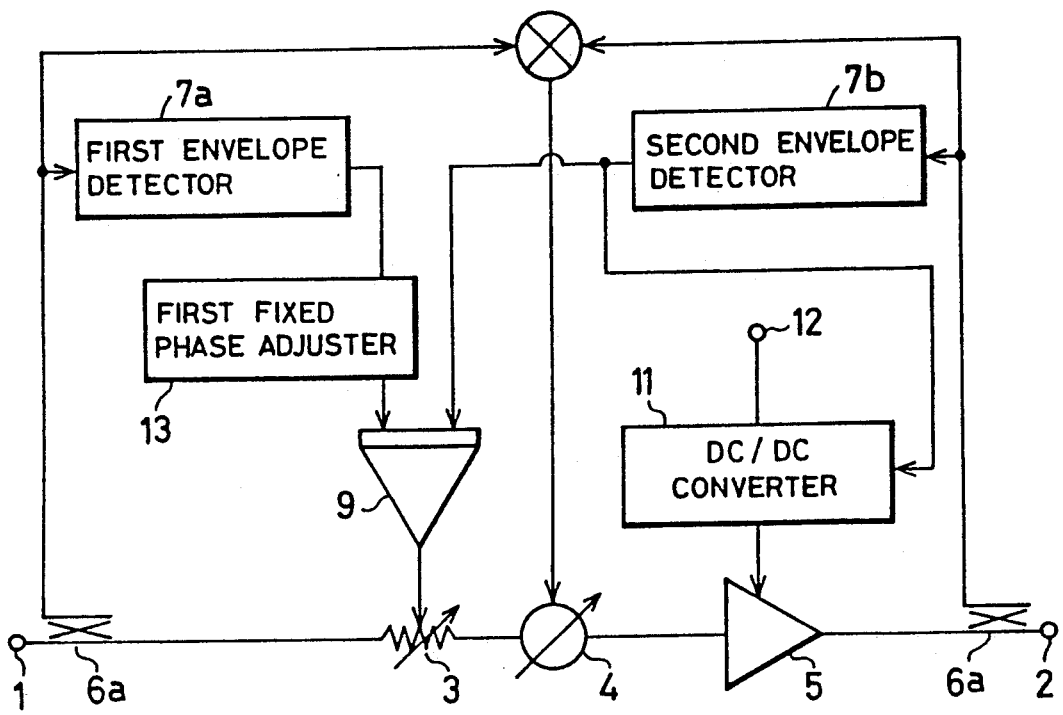
FIG. 3 is a block diagram illustrating a linear amplifier according to a second embodiment of this invention.

FIG. 3 is a block diagram showing a second embodiment of this invention. In FIG. 3, designated at numeral 16 is a phase detector. Parts of the input and output signals are applied to the phase detector 16 via directional couplers 6a and 6b, where the difference in phase therebetween is detected. The phase distortion produced at high-powered amplifier 5 can be compensated by controlling the phase shifter 4 in accordance with the phase-difference detection signal produced by the phase detector 16. The amplitude of the input signal is compensated similarly as in FIG. 2.

Figure 3A:
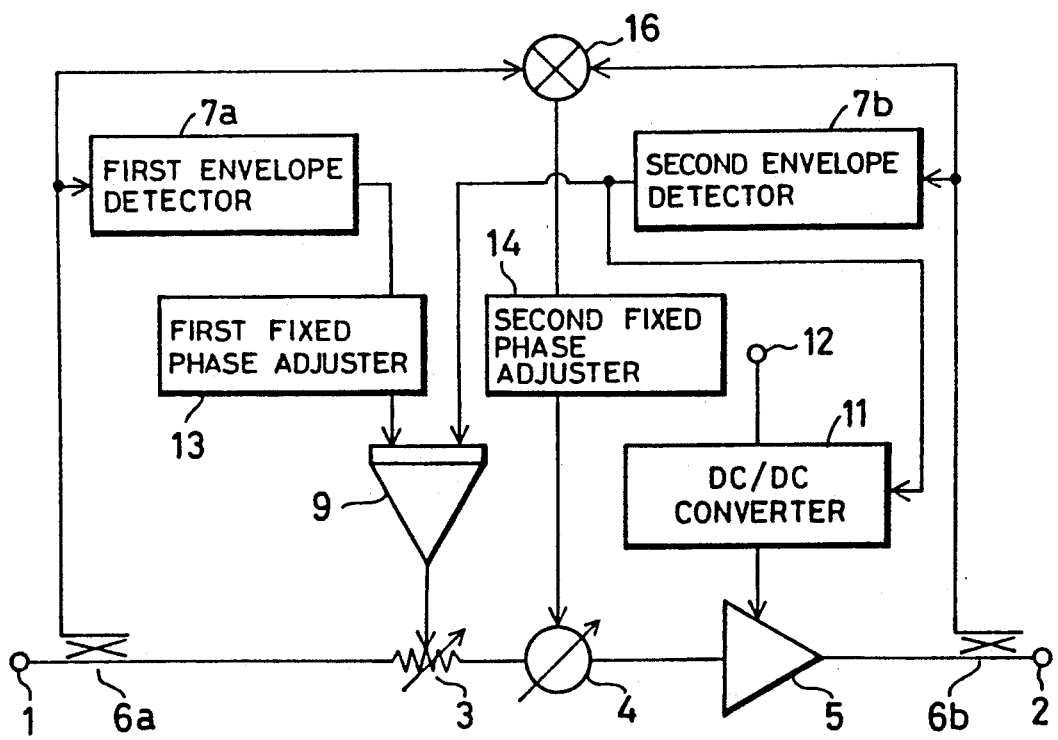
FIG. 3A is a block diagram illustrating a linear amplifier according to a third embodiment of this invention.

FIG. 3A shows a third embodiment of the invention wherein a second fixed phase adjuster 14 is provided to the output of phase detector 16 to compensate a fixed phase difference caused by the transmission path.

According to this invention, as has been described above, parts of the input and output signals are extracted to carry out the comparison in amplitude and in phase therebetween, thus detecting the amplitude distortion and the phase distortion based on the result of the comparison. Then, the variable attenuator and the phase shifter are controlled so as to compensate for the amplitude distortion and the phase distortion. The present invention can therefore bring about advantageous effects in that the circuit of the linear amplifier can be simplified in structure and reduced in size as compared with that of the conventional linear amplifier, and the linear amplifier is applicable to a high-speed and high-frequency band operation because of an all-analog system free from the use of digital arithmetic processing. Further, the present invention can also bring about an advantageous effect in that the operation efficiency can be rendered high because the drain voltage is controlled by the DC/DC converter while following the level of output power.

Having now fully described the invention, it will be apparent to those skilled in the art that many changes and modifications can be made without departing from the spirit or scope of the invention as set forth herein.

What is claimed is:

1. A linear amplifier, comprising:
   a first directional coupler, a variable attenuator, a phase shifter, a high-powered amplifier and a second directional coupler arranged in cascade connection;
   a first signal parameter detector and a first phase detector connected to a coupling terminal of said first directional coupler;
   a second signal parameter detector and a second phase detector connected to a coupling terminal of said second directional coupler;
   a first comparator for comparing an output signal from said first signal parameter detector with an output signal from said second signal parameter detector to control the amount of attenuation of said variable attenuator based on the result of its comparison;
   a second comparator for comparing an output signal from said first phase detector with an output signal from said second phase detector to control the amount of phase shift of said phase shifter based on the result of its comparison; and
   a DC/DC converter supplied with the output signal of said second signal parameter detector for controlling a drain voltage applied to said high-powered amplifier while following the parameter component of an output signal from said high-powered amplifier.

2. A linear amplifier according to claim 1, wherein said signal parameter is the envelope of a signal.

3. A linear amplifier according to claim 2, wherein the output signal of said first envelope detector is applied to said first comparator via a first phase adjuster and the output signal of said second envelope detector is applied directly to said first comparator.

4. A linear amplifier according to claim 1, wherein the output signal of said first phase detector is applied to said second comparator via a second phase adjuster and the output signal of said second phase detector is applied directly to said second comparator.

5. A linear amplifier, comprising:
variable attenuation means for varying the amplitude of an input signal according to a first control signal;
phase shifting means for varying the phase of said amplitude-varied input signal according to a second control signal;
a high-powered amplifier for amplifying said phase-shifted signal and providing the amplified signal as an output signal;

means for comparing the amplitudes of said input and output signals and developing said first control signal as a function of the difference therebetween; and
means for comparing the phases of said input and output signals and developing said second control signal as a function of the difference therebetween, wherein said phase comparing means comprises a local oscillator, a first phase detector for comparing the phase of said input signal with the phase of said local oscillator, a second phase detector for comparing the phase of said output signal with phase of said local oscillator, and a comparator for comparing output signals of said first and second phase detectors to develop said second control signal.

* * * * *